United States Patent [19]

Anantha et al.

[11] 4,228,369
[45] Oct. 14, 1980

[54] INTEGRATED CIRCUIT INTERCONNECTION STRUCTURE HAVING PRECISION TERMINATING RESISTORS

[75] Inventors: Narasipur G. Anantha, Hopewell Junction; Robert A. Henle, Clinton Corners; James L. Walsh, Hyde Park, all of N.Y.

[73] Assignee: International Business Machines Corporation, Armonk, N.Y.

[21] Appl. No.: 865,808

[22] Filed: Dec. 30, 1977

[51] Int. Cl.² ............................ H03K 5/08; H01P 1/26
[52] U.S. Cl. ................................ 307/270; 307/237; 333/22 R; 307/303
[58] Field of Search ............... 333/17 M, 32, 22 L, 333/22 R, 33; 307/303, 270, 279, 237

[56] References Cited

U.S. PATENT DOCUMENTS

| | | | |
|---|---|---|---|
| 3,281,721 | 10/1966 | Clark | 333/17 M |
| 3,581,244 | 5/1971 | Smith | 333/17 M |
| 3,828,281 | 8/1974 | Chambers, Jr. | 333/17 M |
| 4,015,147 | 3/1977 | Davidson et al. | 333/22 R |

OTHER PUBLICATIONS

Dachtera, "Schottky Diode Line Terminator", IBM Tech. Discl. Bull.; vol. 12, No. 11, 4/70, p. 1861.

*Primary Examiner*—Stanley D. Miller, Jr.
*Assistant Examiner*—B. P. Davis
*Attorney, Agent, or Firm*—George O. Saile

[57] ABSTRACT

A small variable resistor is used as a precision terminating resistor in an integrated circuit interconnection structure. The structure involves the use of a driver circuit connected to and driving a plurality of loads which are connected to a transmission line. The transmission line is terminated by the precision variable terminating resistor. The last load in the series of loads is located in the integrated circuit chip which has the variable terminating resistor. The absolute value of the variable resistor is difficult to control. The absolute value of any conventional integrated resistor is hard to control in manufacturing. However, by making the value of the resistance proportional to a voltage which itself is proportional to a deviation from a reference voltage, it is possible to obtain a much more precise value of resistance.

11 Claims, 11 Drawing Figures

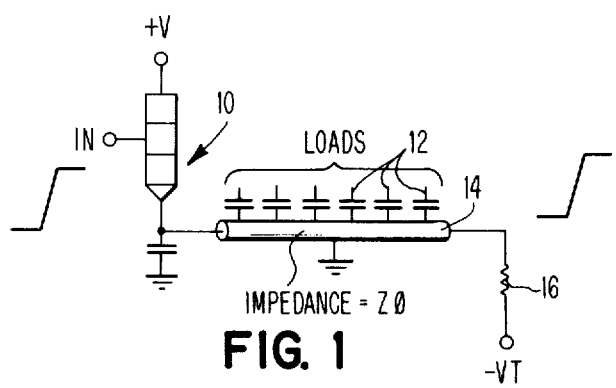
FIG. 1
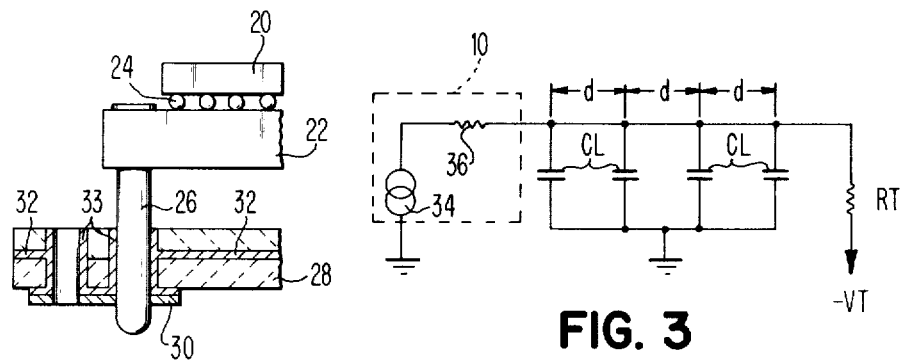
FIG. 2
FIG. 3
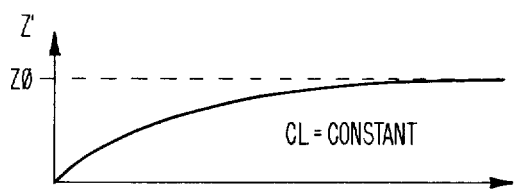
FIG. 4
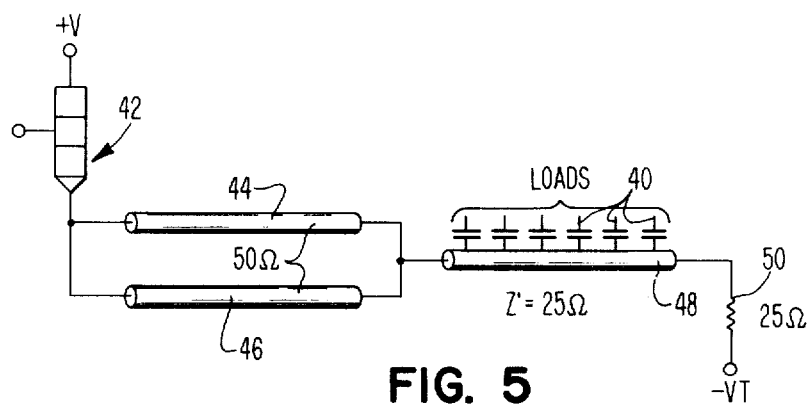
FIG. 5

INTEGRATED CIRCUIT INTERCONNECTION STRUCTURE HAVING PRECISION TERMINATING RESISTORS

BACKGROUND OF THE INVENTION

The invention relates to the interconnection of integrated circuits and more particularly to an integrated circuit interconnection structure which involves the driving of a plurality of loads connected to a transmission line and the termination of the line.

DESCRIPTION OF THE PRIOR ART

The design of a practical digital system encompasses several important factors involving unwanted interactions with its surroundings. Interconnections between integrated circuit devices are a source of signal loss, signal distortion and power dissipation. It is principally the capacitances involved with the interconnection between integrated circuit devices that cause such problems. It is particularly a problem where interconnection paths are extended ones wherein the interconnection is in effect a transmission line. Whenever the electrical length of the line interconnecting a driver and its load becomes long compared to the rise time on the line, then the line becomes a transmission line and reflections will appear on the line if it is not terminated by its characteristic impedance.

It has been standard practice in digital systems to utilize a driver circuit to drive a series of loads through a transmission line. The transmission line being terminated with a suitable terminating resistor. This has been done where the circuits were made of discrete NPN or PNP transistors connected through coaxial cables in the earlier days of semiconductor technology. The terminating resistors were in this case discrete resistors. With the advent of small scale integrated circuits, the integrated circuit modules were positioned on carrying boards. Driver circuits and their loads were in the various integrated circuit chips on the modules. The terminating resistors were precision film type resistors which were molded into plastic packages for mounting between the modules which contain chips having only a few integrated circuits. With the increase of integration in the integrated circuit devices, there became no room for the resistor plastic packages between the modules. In this technology, individual semiconductor chips were fabricated with a collection of diffused resistors for use as terminating resistors therein. The higher density integrated circuit chips were then mounted adjacent to the diffused resistor chips. The tolerances of the diffused resistors are quite poor.

The impedance of the transmission lines which are used is low and for the signals that must be used, the current on the transmission lines becomes quite high. This current flows through the diffused terminating resistors and since the tolerance of these resistors is poor, the variance of power dissipation in the resistors is unacceptably large. Also, the magnitude of reflections on the transmission line are also increased by the poor tolerance of the diffused resistors.

Variable resistance elements have been known in the prior art. Such variable resistance elements have been used in memory cell circuits. They often take the form of a resistance region having a diffusion therein. The resistor is principally located in a central region which is commonly referred to as a channel. This channel may be pinched electrically by applying a suitable voltage to the electrode connected to the centrally diffused region. This type of variable resistor is shown in the G. B. Potter U.S. Pat. No. 3,510,735, S. K. Wiedmann, U.S. Pat. No. 3,693,057, Imazumi et al U.S. Pat. No. 3,801,886, Mudge et al U.S. Pat. No. 3,979,612 and in the "Physics and Technology of Semiconductor Devices", A. S. Grove, published by John Wiley & Son, Inc. New York, copyright 1967, pages 244–251.

SUMMARY OF THE PRESENT INVENTION

In accordance with the present invention, an integrated circuit interconnection structure is described that is particularly advantageous for high density integrated circuit structures. Driver circuits in various integrated circuit devices are connected through a transmission line to a series of loads. The driver circuit drives each of these loads in the series. The term series is used in the sense of time separation that is a signal coming down the line switching the first load, then the second load, etc. The last load of a series of loads is located in an integrated circuit device chip which has a variable terminating resistor. This variable terminating resistor is the terminating resistor for the transmission line. Circuit means are provided for generating and applying a voltage to the variable terminating resistor to adjust the resistance of that resistor so that there is a precise termination of the transmission line.

The preferred means for generating the voltage to adjust the resistance of the terminating resistor is the use of a voltage comparator. The voltage comparator has a reference voltage and a signal voltage input. The signal voltage input is proportional to the actual resistance of the variable terminating resistor. The reference voltage is proportional to the desired value of the terminating resistor. The output of the comparator is therefore proportional to the difference between the actual resistance value and the desired resistance value. When this difference voltage is applied to the proper terminal of the variable terminating resistor, it causes the resistance to vary and become closely equal to the desired value. This results in a reduction in the variation in power dissipation and a reduction in reflections.

One comparator can contact a plurality of resistors. It is advantageous to have one comparator to handle many resistors because of the savings in silicon chip area. Such as arrangement is practical because although integrated diffused resistors have wide tolerance variation on a chip, they have generally very little variation with respect to each other. That is, their absolute values all may be significantly above or below some desired value, but their respective difference in values is quite small. This is called tracking and because resistor values closely track, one comparator is capable of being used to adjust the values of many resistors on the same chip.

BRIEF DESCRIPTION OF THE DRAWINGS

FIG. 1 shows a basic emitter follower driver circuit for a series of loads and its terminating resistor;

FIG. 2 is a schematic illustration of an integrated circuit chip carried on a module which module in turn is carried on a board;

FIG. 3 shows the impedance and load capacitance characteristic of the FIG. 1 circuit;

FIG. 4 shows a characteristic curve of the loaded line impedance versus the spacing between the loads;

FIG. 5 illustrates two unloaded transmission lines connected in parallel to match a loaded transmission line;

DESCRIPTION OF THE PREFERRED EMBODIMENTS

Figure 6:
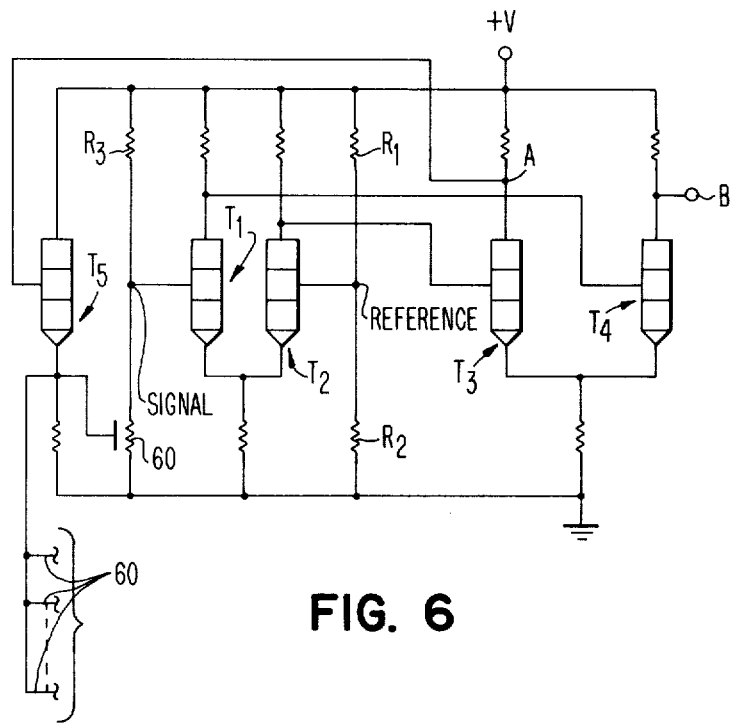
FIG. 6 is a first circuit embodiment of a means for generating and applying a voltage to a variable terminating resistor.

FIG. 1 shows a basic emitter follower driver circuit 10 used to drive a plurality of loads 12 on a transmission line 14. The plurality of loads 12 may have many different spacings between loads. These different spacings create a wide range of possible impedances, all of which must be terminated by terminating resistor 16. It is not practical to employ an infinite number of terminating resistors of different values to do termination for the various loads. Therefore, it has been the practice to design the interconnecting structure to accept some reflections and to reduce the number of terminating resistor values required for a interconnection structure of semiconductor devices.

FIG. 2 shows the individual physical packaging elements which the driver circuit and the loads see. An integrated circuit chip 20 is mounted onto the surface of module 22 by means of solder reflow connections 24. Conductive lines are located on the surface of the module 22 and connect to the various solder connectors 24. Alternatively, the substrate 22 can be a multi-layer ceramic structure having metal lines within the body of the substrate 22. The module pins 26 physically and electrically connect the integrated circuits in the semiconductor device 20 to a board 28. The pins 26 extend through an opening in the board 28 and make connection such as by metal layers 30 to electrical transmission lines 32 within the board 28. There are two redundant openings for each pin for engineering change purposes. Each opening has a metal conducting layer 33 over its surface. The loads which are called stubs are made up of the total capacitances of the individual physical packaging elements such as the holes, pins, module layers and so forth. The FIG. 1 basic emitter follower driver interconnection structure, shows the capacitance of each load distributed along the transmission line according to the location of each module to be driven by the driver circuit 10.

Referring now to FIGS. 3 and 4, the elements of an equivalent circuit to that of FIG. 1 circuit is shown where the stub load capacitances CL is considered. The driver circuit 10 is illustrated in FIG. 3 to include the dashed line which comprises a voltage source 34 and an internal impedance 36. The transmission line now has a loaded line impedance Z' rather than the unloaded line impedance Zφ and the driver circuit must provide for reduction in impedance. The following is the relationship between the loaded line impedance and the unloaded line impedance:

$$Z' = \frac{Z\phi}{1 + \frac{\mu CL}{Cd}}$$

μ = # of loads of CL
C = unloaded line capacitance
d = spacing between CL loads
Zφ = unloaded line impedance
Z' = loaded line impedance FIG. 4 illustrates the variation of the loaded line impedance with spacing, d, between the stub load capacitances CL for a constant stub load capacitance CL. This plot is for the condition where the transmission line is uniformly loaded and the spacing, d, is varied. Where this is not the case, the transmission line might be broken up into pieces. An example of this case is shown in FIG. 5 where a series of loads 40 is driven by a driver circuit illustrated as transistor 42 wherein the loads are a substantial distance from the driver circuit. Here it is necessary to use two unloaded 50 ohm transmission lines 44 and 46 in parallel to match the loaded transmission line 48. The effective impedance Z1 has an impedance of 25 ohms and therefore must be terminated with a terminating resistor 50 of 25 ohms.

Typical values that might occur in various technologies are for the stub load capacitance CL are in a small scale integration 6.3 pf. and in a large scale integrated circuits 3 to 9 pf. Typical unloaded line impedance Zφ for boards is 70-90 ohms and for modules 40-70 ohms for both small scale and high scale integration. Typical length of the transmission line is 50-70 inches maximum. Minimum loaded line impedance Z' is of the order of 30 ohms. The spacings, d, is in the order of 1.2 inches for small scale integration and greater or equal than 0.5 inches for high scale integration.

FIG. 6 shows a first embodiment of circuit meanings for generating and applying a voltage to variable terminating resistors 60 to adjust the resistance so that there is precise termination of the transmission line. The means for generating the voltage is in this embodiment a differential amplifier that includes transistors T1 and T2. Reference and signal voltage inputs are compared and an output which is the difference between the reference and signal voltages result. The output of the differential amplifier T1 and T2 is fed to the second differential amplifier which includes transistors T3 and transistor T4. The output of the second differential amplifier is fed back through an emitter follower driver transistor T5 to control the value of the variable resistors 60 in a manner designed to reduce the difference output of the first differential amplifier. The resistor R1 and R2 are integrated resistors whose precise values ae not important to the operation of the circuit. It is important that the ratio of the resistances be controlled or tracked. The resistor R3 does not have to have high frequency characteristics of the first order of importance since the resistor is not used as a terminating resistor. The value of the reference voltage is determined by the ratio of resistors R1 and R2. The value of the variable resistance can be written as Variable resistance = $K \times R3\ (R2/R1)$ where K is a variable which relates the gain of the comparator and the characteristics of the variable resistor. The output of the emitter follower transistor T5 drives all of the variable resistors 60 on the integrated circuit device chip. The illustrated circuit arrangement shows a terminating resistor 60 returned to ground. A similar arrangement of amplifier could be used for other terminating resistor biases.

Figure 7:
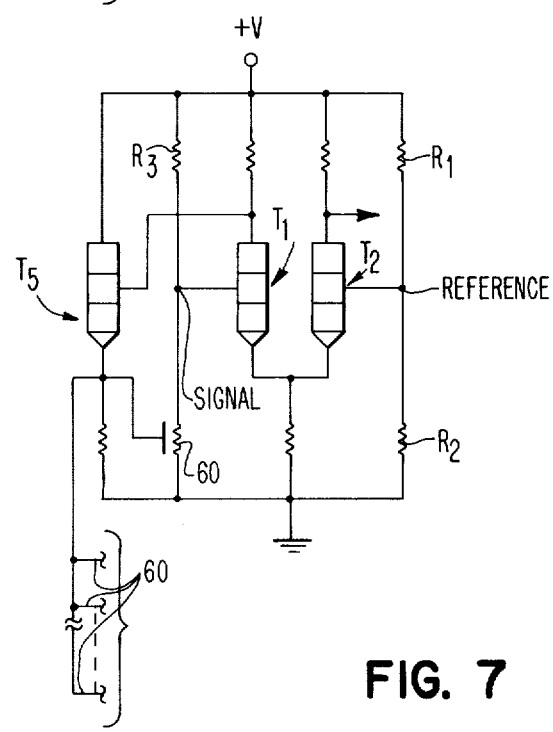
FIG. 7 is a second embodiment of a circuit means for generating and applying a voltage to a variable terminating resistor.

FIG. 7 shows a second and simplified embodiment of a circuit means for generating and apply a voltage to a variable resistor. The second differential amplifier T3 and T4 in FIG. 6 is only required for increased precision in the control of the variable terminating resistor. The present FIG. 7 shows how the circuit would appear without the second differential amplifier. Since the circuits in FIGS. 6 and 7 are very similar, like numbers are used for like circuit structures and the operation is substantially the same.

Figure 8:
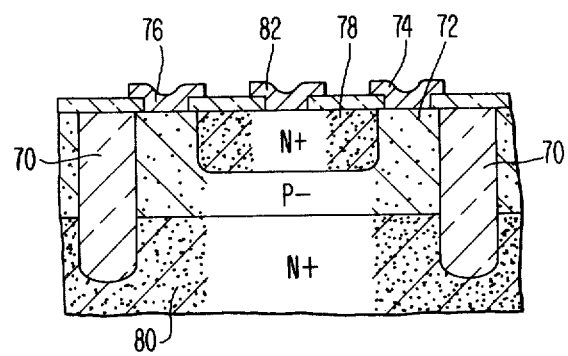
FIG. 8 is a semiconductor structure of one form of a resistor which is useful as a variable terminating resistor in the present invention.

FIG. 8 shows one form of a variable resistor 60 that was used in the circuits in FIGS. 6 and 7. FIG. 8 shows an isolated monocrystalline silicon region formed by means of isolation material 70 which may be dielectric isolation or junction isolation which are both conventional isolation techniques. The illustrated resistor 72 is P type with contacts 74 and 76 at opposite ends of the resistor 72. A first N+ region 78 is centrally located within the resistor body 72. The region 78 makes a narrow channel between itself and the second N+ region 80 located on the opposite side of the P type resistor. Contact 82 is made to the region 78. It is to this contact 82 that the voltage used to adjust the resistance of the resistor 72 is made. The opposite conductivity type to that shown is possible where region 72 is N− and regions 78 and 80 are P+. In the structure shown in FIG. 8, the N+ regions 78 and 80 are always biased positive with respect to region 72. This means that depletion regions exist primarily in region 72. When the bias voltages are made more positive, the depletion regions widen and the resistance between terminals 74 and 76 increase. The opposite effect occurs when the positive bias is reduced The bias voltage is applied to terminal 82 and this is the terminal the comparator output (T5 in FIG. 7) is connected to. Region 80 in FIG. 8 has a constant bias applied. Because this region extends over the entire chip, it is common practice to use only one bias terminal. This is not shown in FIG. 8.

Figure 9:
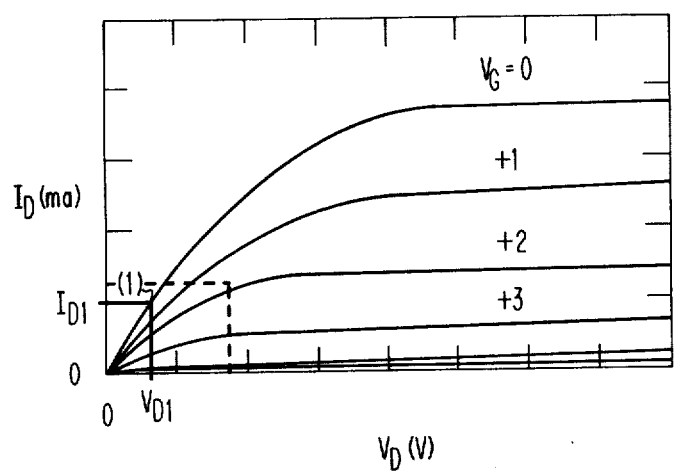
FIG. 9 shows current-voltage characteristics for various gate voltages for the FIG. 8 type of variable resistors.

In FIG. 9, the region of possible operation is shown under the dotted line. For any given value of $V_G$, which is the voltage applied to terminal 82, the actual value the terminating resistor assumes is given as the ratio of $V_D$ to $I_D$ at a point on the $V_G$ curve. For example, the point number 1 in FIG. 9 is on the $V_G=0$ curve within the dotted line. The resistor value is $V_{D1}$ divided by $I_{D1}$.

Figure 10:
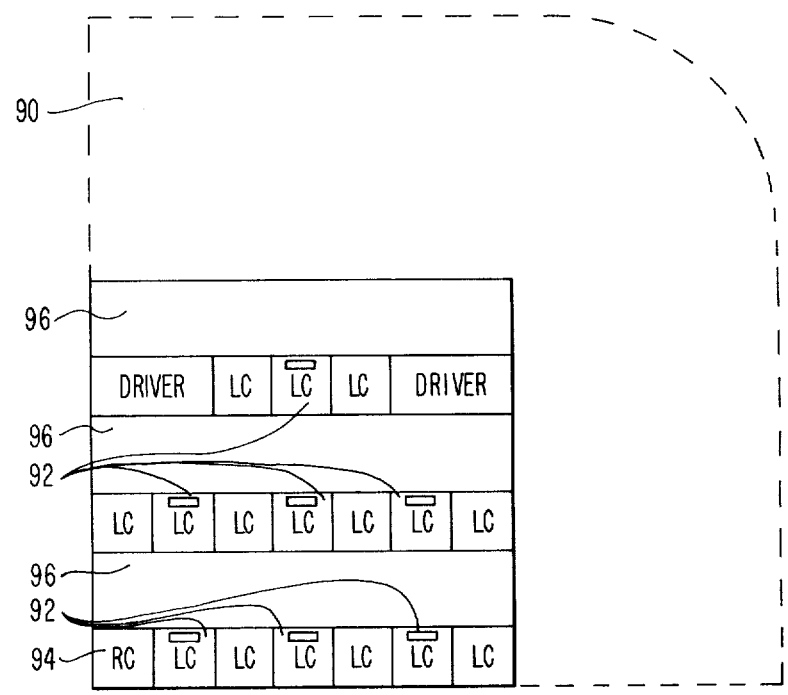
FIG. 10 is a schematic layout of a portion of a integrated circuit device useful in the present invention.

FIG. 10 shows a schematic layout of a high density integrated circuit chip. The silicon integrated circuit chip 90 has a portion of its surface laid out in the FIG. 10. The logic circuits, LC, may be in any of the various bipolar technologies such as emitter coupled logic, transistor-transistor coupled logic and diode-transistor coupled logic. The regions 92 are logic circuits similar to the logic circuit regions, LC, but each have a variable terminating resistor within its region. There are driver circuit regions indicated as Driver. Also on the layout is cell 94 which is the reference voltage cell, RV. The reference voltage cell 94 is the means for generating and applying a voltage to the variable resistors in the integrated circuit. There may be as few as one of these reference voltage cells 94 on an integrated circuit chip or there can be many of these cells located in regions to control the variable resistors in a given region. The regions 96 are regions designated for on chip wiring.

Figure 11:
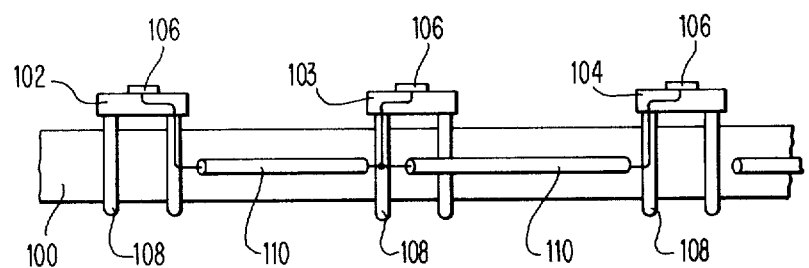
FIG. 11 is a schematic illustration of the connection of high density integrated circuits carried on modules which modules are in turn carried on a board containing transmission lines.

FIG. 11 illustrates module carrier or board 100 which carries modules 102, 103 and 104. The modules each have integrated circuit chips 106 thereon of the type shown in FIG. 10. The modules are physically and electrically attached to the board 100 by means of pins 108. Within the board 100 is a transmission line 110 which interconnects circuits on the integrated circuit delay chips 106.

While the invention has been particularly shown and described with reference to the preferred embodiments thereof, it will be understood by those skilled in the art that the foregoing and other changes in form and details may be made therein without departing from the spirit and scope of the invention. For example, there are many other differential amplifier designs which could be used for this application.

What is claimed is:

1. An integrated circuit interconnection structure comprising:
   a driver circuit in an integrated circuit device;
   a transmission line having a series of loads connected thereto;
   said driver circuit driving said loads through said transmission line;
   the last load in said series of loads being located in an integrated circuit chip which has a variable terminating resistor;
   means for generating and applying a voltage to said variable terminating resistor to adjust its resistance so that there is precise termination of said line; and
   said variable resistor is a pinch resistor having a contact to which said voltage to adjust its resistance is applied.

2. The integrated circuit interconnection structure of claim 1 wherein said pinch resistor is a P type resistor having electrical contacts to the ends thereof, a first N+ region centrally located within said P type resistor;
   a second N+ region located on the opposite side of said P type resistor to that of said first N+ type region; and
   said contact to which said voltage to adjust its resistance is made to said first N+ type region.

3. An integrated circuit interconnection structure comprising:
   a driver circuit in a integrated circuit device;
   a transmission line having a series of loads connected thereto;
   said driver circuit driving said loads through said transmission line;
   the last load in said series of loads being located in an integrated circuit chip which has a variable terminating resistor;
   means for generating and applying a voltage to said variable terminating resistor to adjust its resistance so that there is precise termination of said line; and
   said means for generating a voltage comprises a voltage comparator having a reference voltage and signal voltage inputs and an output which is the difference between the referenced and signal voltages.

4. The integrated circuit interconnecting structure of claim 3 wherein said means for applying a voltage includes a circuit means for controlling the value of said variable resistor and wiring means to connect said means for generating a voltage to said variable resistor.

5. The integrated circuit interconnection structure of claim 4 wherein said variable resistor is a P type resistor having electrical contacts to the ends thereof, a first N+ region centrally located within said P type resistor, second N+ region located on the opposite side of said P type resistor to that of said first N+ type region; and
   said contact to which said voltage to adjust its resistance is made to said first N+ type region.

6. An integrated circuit interconnection structure comprising:
   a driver circuit in an integrated circuit device;
   a transmission line having a series of loads connected thereto;
   said driver circuit driving said loads through said transmission line;
   the last load in said series of loads being located in an integrated circuit chip which has a variable terminating resistor;
   means for generating and applying a voltage to said variable terminating resistor to adjust its resistance so that there is precise termination of said line; and
   said means for generating and applying a voltage is on the same integrated circuit device as said last load and variable resistor.

7. An integrated circuit interconnection structure comprising:
   a driver circuit is an integrated circuit device;
   a transmission line having a series of loads connected thereto;
   said driver circuit driving said loads through said transmission line;
   the last load in said series of loads being located in an integrated circuit chip which has a variable terminating resistor;
   means for generating and applying a voltage to said variable terminating resistor to adjust its resistance so that there is precise termination of said line; and
   emitter coupled logic circuits are used in the said driver circuit and said loads.

8. An integrated circuit interconnection structure comprising:
   a driver circuit in an integrated circuit device;
   a transmission line having a series of loads connected thereto;
   said driver circuit driving said loads through said transmission line;
   the last load in said series of loads being located in an integrated circuit chip which has a variable terminating resistor;
   means for generating and applying a voltage to said variable terminating resistor to adjust its resistance so that there is precise termination of said line; and
   transistor-transistor coupled logic circuits are used in the said driver circuit and said loads.

9. An integrated circuit interconnection structure comprising:
   a driver circuit in an integrated circuit device;
   a transmission line having a series of loads connected thereto;
   said driver circuit driving said loads through said transmission line;
   the last load in said series of loads being located in an integrated circuit chip which has a variable terminating resistor;
   means for generating and applying a voltage to said variable terminating resistor to adjust its resistance so that there is precise termination of said line; and
   diode-transistor logic circuits are used in the said driver circuit and said loads.

10. In an integrated circuit interconnection structure having a driver circuit connected to and driving a plurality of loads which are connected to a transmission line and which transmission line is terminated by a terminating resistor, the improvement comprising:
    the said terminating resistor is a variable resistor and located in the integrated circuit of the last of said plurality of loads;
    means for generating and applying a voltage to said variable resistor to adjust its resistance so that there is a precise termination of said line; and
    said variable resistor is a P type pinch resistor having electrical contacts to its ends, a first N+ region centrally located within said P type resistor, a second N+ region located on the opposite side of said P type resistor to that of said first N+ type region, and a contact to said first N+ region to apply said voltage to adjust the resistance of said variable resistor.

11. The integrated circuit interconnection structure of claim 10 wherein said means for generating a voltage comprises a voltage comparator having reference voltage and signal voltage inputs and an output which is the difference between the said reference and signal voltages.

* * * * *